United States Patent [19]

Slatterly

[11] Patent Number: 4,620,661
[45] Date of Patent: Nov. 4, 1986

[54] CORROSION RESISTANT LID FOR SEMICONDUCTOR PACKAGE

[75] Inventor: James A. Slatterly, Sauguoit, N.Y.

[73] Assignee: Indium Corporation of America, Utica, N.Y.

[21] Appl. No.: 725,673

[22] Filed: Apr. 22, 1985

[51] Int. Cl.$^4$ .................................... H01L 23/06
[52] U.S. Cl. .................... 228/209; 29/588; 204/23; 204/40; 427/125
[58] Field of Search ............ 427/125, 405; 428/620, 428/635, 672, 679; 204/40, 49, 23; 29/588; 228/209

[56] References Cited

U.S. PATENT DOCUMENTS 3,362,851  1/1968  Dunster ........................ 428/620
4,331,258  5/1982  Geschwind ................... 29/588
4,356,047 10/1982  Gordon ......................... 29/588

*Primary Examiner*—John D. Smith
*Attorney, Agent, or Firm*—Bruns and Wall

[57] ABSTRACT

A lid for closing an electronic package that exhibits high resistance to corrosion. The lid includes a metal substrate and a multi-layered protective coating which has low porosity when compared to a single layer coating of the same thickness yet has good soldering properties that enables the lid to be hermetically sealed to the package container. The multi-layer coating includes an initial electroplated layer of nickel followed by a thin interlayer of a noble metal and a second layer of nickel electroplated over noble metal. A top layer of gold is then electroplated over the nickel-noble metal-nickel sandwich to complete the lid structure.

8 Claims, 2 Drawing Figures

CORROSION RESISTANT LID FOR SEMICONDUCTOR PACKAGE

BACKGROUND OF THE INVENTION

This invention relates to a corrosion resistant lid used to close a semiconductor package and, in particular, to a lid having a low porosity multilayer coating.

In many semiconductor applications, the semiconductor device is required to be hermetically sealed within a "package" or housing which protects the device from the surrounding ambient and thus enhances its reliability. As explained in further detail in U.S. Pat. Nos. 3,340,602; 3,538,597; 3,874,549 and 3,946,190, the package typically includes a container having a cavity in which the device is securely seated. Electrical leads are passed out of the container and are connected to appropriate circuitry. The package is closed using a lid which is placed in registration over the cavity and sealed in place using a eutectic solder frame formed of an alloy made up of 80% gold and 20% tin.

The lid that is used throughout the industry is typically made from a Kovar stamping. Kovar is a well known tradename that identifies an alloy containing various amounts of cobalt, nickel and iron. Lids have heretofore been provided with a top coating of gold that is placed over an inner layer of nickel. The coating provides an excellent bonding surface for the solder frame and also provides a corrosion resistant shield for the Kovar substrate which, because it contains iron, is highly susceptible to rust damage. The nickel interface usually consists of between 50 and 150 microinches of low stress nickel while the top coat consists of about 50 microinches of pure gold. Although this dual combination exhibits good solderability, the lid nevertheless will rust when exposed to a corrosive atmosphere for any period of time. Corrosion in amounts of between 2–4% of the total surface area of the lid will generally occur within 24 to 96 hours when the coated lid is exposed to a salt containing atmosphere.

The accepted standards in the industry which governs the amount of corrosion allowable for high reliability packages is set out in the military specification Mil. Std. 883 C. This specification has been recently revised so that all lids now must remain corrosion free (zero corrosion) after being exposed to a salt containing atmosphere for at least 24 hours. Dual coated lids found in the prior use, i.e. those having a first coating of nickel and a top coating of gold, continually fail the corrosion test as set out in these specifications.

All electroplated metal coatings exhibit porosity to some extent and thus permit rust producing atmospheres to pass therethrough to the base metal. Methods have been tried with varying degrees of success to reduce the porosity of protective coatings and to increase the resistance of these lids to corrosion. Porosity is usually inversely proportional to the thickness of an electroplated metal and the pores that initially form in the coating material close gradually as more metal is deposited. As the coating thickens, the pores eventually close. Approximately 2000 microinches of nickel and about 100 microinches of gold are required, however, to completely close the pores on a dual coated lid. (See Harper, Charles A., *Handbook of Materials and Processing for Electronics*. McGraw Hill, 1970, p. 10–56). The consumption of this amount of metal is not only expensive but also requires an extraordinary amount of time to complete the plating process.

Pulse plating has also been tried with some limited success in an effort to close the pores in the coating materials. In this process, the current applied to the electroplating tank is pulsed on and off periodically by a square wave generator. The pulsing provides for increased ion mobility in the bath which, in turn, results in a smaller more densely packed crystal structure in the electroplated metals. This denser deposit is believed to fill the pores more rapidly and thus provide greater protection for a given coating thickness. Although the amount of corrosion may be reduced by this technique, pulse coating alone cannot provide economically feasible products capable of meeting the new standard within the industry.

SUMMARY OF THE INVENTION

It is therefore an object of the present invention to improve electronic packages used to house semiconductor devices.

It is a further object of the present invention to improve lids used to hermetically seal semiconductor packages.

It is a further object of the present invention to improve the corrosion resistant properties of a closure lid for a semiconductor package without sacrificing the solderability of the lid.

It is another object of the present invention to provide a multi-layered coating for an electronic package closure lid that will resist corrosion over a long period of time when exposed to a corrosive atmosphere.

Yet another object of the present invention is to reduce the porosity of the protective coating used to shield a lid used to close an electronic package.

Still another object of the present invention is to provide a lid for closing an electronic package that fully conforms with the prevailing industry standards.

These and other objects of the present invention are attained by means of a lid used to close an electronic package that includes a metal substrate having a multi-layered protective coating electroplated thereon which comprises a first layer of nickel, a second layer of a noble metal or an alloy containing a noble metal, a third layer of nickel and a top layer of gold. The multi-layered coating serves to not only close the pores in the coating structure and thus enhance the lid's resistance to corrosion but also preserves the lid's ability to be hermetically sealed to the package.

BRIEF DESCRIPTION OF THE DRAWINGS

For a better understanding of these and other objects of the present invention reference is had to the following detailed description of the invention which is to be read in conjunction with the accompanying drawings, wherein.

DESCRIPTION OF THE INVENTION

Figure 1:
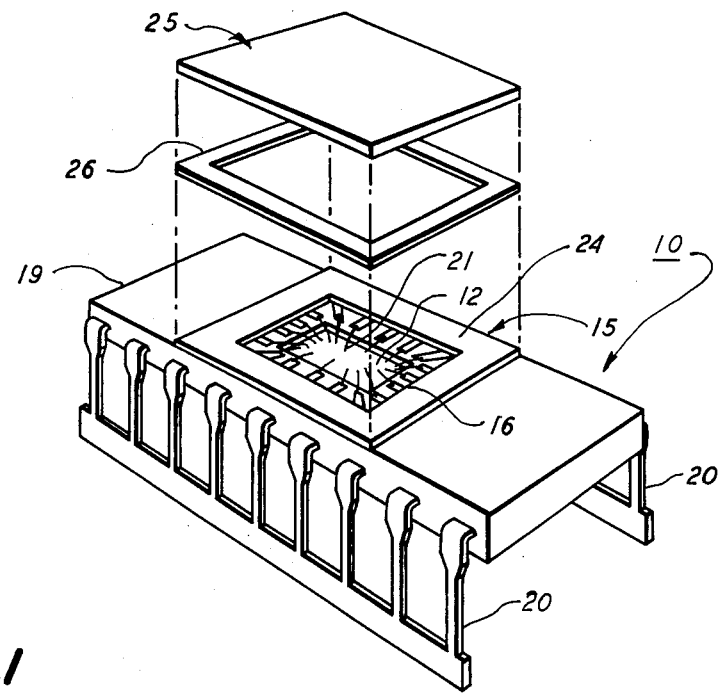
FIG. 1 is a perspective view of an electronic package showing the lid and the solder frame separated from the package.

Turning now to the drawings there is shown a typical electronic package, generally referenced 10, used in the industry to hermetically house a semiconductor chip 12. The package includes a ceramic container 15 having a chip cavity 16 in which is seated a semiconductor chip 12. Although not shown, the chip is securely affixed to the bottom wall of the cavity by means of a gold-silicon die-attach. The container 15 is carried upon a supporting member 19 that may also be made of a ceramic material and which further carries a series of terminal pins 20—20 disposed along either side edge as shown. The pins are passed into the chip cavity and are connected to the semiconductor device by fine wire leads 21—21.

The top opening of the container is surrounded by an imbedded metallic apron 24 against which the closure lid 25 is sealed. Sealing is accomplished using a solder frame 26 that is interposed between the apron and the lid. The frame is made of a eutectec solder containing 80% gold and 20% tin. The frame and lid are placed in registry against the apron and heated to the desired fusing temperature whereupon the lid is sealed to the container.

In this type of high reliability packaging, it is essential that the frame, when fused, forms a hermetic seal between the lid and the container. The integrity of the seal, among other things, is a function of the top coating contained on the lid. High reliability lids used in the electronic packaging industry almost universally utilize a Kovar substrate. Kovar is a tradename that is used to identify a cobalt-nickel-iron alloy. Although this alloy has many desirable properties, it nevertheless does not provide a good surface against which the solder frame can seal. The lid is therefore typically provided with a gold top coating to enhance its solderability.

Heretofore, Kovar lids were electroplated to provide a first coating of between 50–150 microinches of low stress nickel a top layer of about 50 microinches of pure gold. This combination insured not only good solderability but also furnished a good but not complete corrosion resistance shield. As noted, this combination multi-layer coating will have a certain amount of porosity that allows the atmosphere to reach the Kovar base metal. The iron in the base metal, when exposed to the atmosphere at the pore sites, will oxidize and corrode. As the corrosion spreads, the protective coating is compromised and will blister and eventually flake away to further expose the base metal. Accordingly, this conventional nickel-gold coating will not meet present day industry standards.

As previously noted, porosity is a function of the electroplating thickness. The pores initially formed in the coating layer or layers decrease and eventually close with the continued deposition of metal. However, relatively large amounts of both nickel and gold are needed to fully close the pores in the dual coating that is now widely used in the art. To produce a pore free coating of this type takes a great deal of electroplating time, is extremely expensive because of the amount of metal involved and consumes a good deal of energy.

Figure 2:
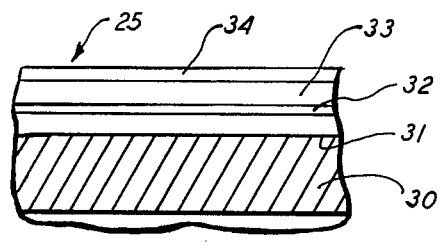
FIG. 2 is an enlarged partial end view in section showing the construction of the present lid.

The lid of the present invention is designed to eliminate or considerably reduce the amount of porosity in the protective coating while at the same time holding metal consumption to a minimum and still preserving the ability to produce a hermetic seal. As shown in FIG. 2, the lid is formed of a base metal substrate 30 made of Kovar which has been formed as by stamping to a desired shape. The substrate typically is about 0.010 inches thick. A first layer of nickel 31 is electroplated over the substrate to a thickness of between 75 and 300 microinches with about 100 microinches being preferred. This is followed by a relatively thin interlayer 32 of a noble metal or an alloy containing a noble metal which is electroplated over the initial nickel layer, preferably the interlayer is formed of relatively pure gold. The second layer is plated to a thickness of between 5 and 50 microinches with about 10 microinches being preferred. A third layer 33, which is also nickel, is electroplated to about a thickness equal to that of the first nickel layer over the noble metal interlayer. This is followed by a final top coating 34 of relatively pure gold which is electroplated over the nickel-noble metal-nickel sandwich to a thickness of about 25 and 60 microinches with about 50 microinches being preferred. Although the noble metal interlayer may be formed of pure gold, other pure or alloyed precious metals such as silver, palladium or platinum may also be similarly employed without departing from the teachings of the present invention.

In the present lid structure, the porosity of the initial nickel layer is reduced by the relatively thin noble metal interlayer due to the difference in the crystal orientation of the two superimposed metals. Similarly, the porosity of the structure is further reduced by the third nickel layer whose crystal orientation again differs from that of the noble metal interlayer. Finally, the gold topcoat over the third layer of nickel serves to further reduce the porosity of the overall structure to a point where the lid's resistance to corrosion is greatly enhanced when compared to coatings of similar thickness. The present lid is, in fact, well able to meet the industry standards as expressed in Mil. Std. 883 C. It should be further noted that the individual layers of the four layer coating are each relatively thin and the coating can be electroplated within an acceptable period of time using a steady state d.c. plating technique. A pulse plating process may also be employed for more densely packing the crystals in the electrodeposit.

The following Examples are included to and in the understanding of the invention and variations may be made by one skilled in the art without departing from the spirit of the invention.

EXAMPLE 1

A substrate was stamped from a 0.010 inches thick sheet of commercial grade Kovar rolled stock to form a lid. After the lid was cleaned and degreased, it was electroplated in a bath to place about 100 microinches of nickel over the substrate. The base coating was followed by a second electroplating step to place about 10 microinches of relatively pure gold over the base layer. A third electroplating step followed in which about 100 microinches of nickel was placed over the gold intermediate coating. Finally, a top coating of gold was electroplated to a thickness of about 50 microinches over the third coating.

The multicoated lid was then cleaned and placed in a precleaned exposure chamber upon a special support bracket made of a non-corrosive material that will not cause electrolytic corrosion when placed in contact with the lid. A solution having a salt concentration of between 0.3 and 0.5 percent by weight sodium chloride in water was prepared and the pH of the solution adjusted to about between 6.0 and 7.5 at 95° F. The specimen was then exposed to a direct flow of salt fog created from the solution. The solution was passed through the chamber at a desired rate so that between 10,000 and 50,000 milligrams of salt was deposited on each square millimeter of exposed area during a 24 hour period.

The lid was exposed to the salt atmosphere at 95° F. for a period of 24 hours and the specimen then removed from the chamber, washed in de-ionized water for 5 minutes, and visually examined for signs of corrosion under between 10× and 20× magnification. The specimen was found to be free of all signs of corrosion including discoloration, electrochemical degradation or corrosion sites. The test was repeatd a number of times with the same results.

EXAMPLE 2

The test as described, with reference to Example 1 was repeated a number of times using the electroplating steps as noted above. The second 10 microinch coating of gold however was replaced by a 25 microinch coating of a palladium-nickel alloy. Examination of the test specimens under magnification, after it had been exposed to a salt fog for 24 hours, again failed to show any signs of corrosion.

While this invention has been disclosed with specific reference to the details as set forth above, it is not intended to be limited to the specific structure and the invention is intended to cover any modifications or changes that may come within the scope of the following claims.

I claim:

1. The method of manufacturing a closure device for hermetically sealing an electronic package that includes the steps of forming a sheet of an iron based metal into a lid for closing an electronic package, electroplating a first layer of nickel to a thickness of at least 75 microinches over the entire outer surface of the lid, electroplating a thin layer of a noble metal or an alloy of a noble metal over the entire outer surface of the first layer, said second layer being about one-tenth the thickness of the first layer, electroplating a third layer of nickel over the entire outer surface of said second layer, the thickness of said third layer being about equal to the thickness of said first layer, and electroplating a top layer of gold over the entire outer surface of the third layer to a thickness of at least 25 microinches to provide a surface that is capable of being bonded to a gold-tin solder frame to form a hermetic seal therebetween.

2. The method of claim 1 wherein the second layer is formed of gold.

3. The method of claim 1 wherein the second layer is formed of silver.

4. The method of claim 1 wherein the second layer is formed of a palladium-nickel alloy.

5. The method of claim 1 wherein the first and third layers are plated to a thickness of between 75 and 300 microinches.

6. The method of claim 1 wherein the second layer is plated to a thickness of between 5 and 50 microinches.

7. The method of claim 1 that includes the further step of bonding a solder frame to the top of the top coating of the lid.

8. The method of claim 1 wherein the top coating is plated to a thickness of between 25 and 60 microinches.

* * * * *

UNITED STATES PATENT AND TRADEMARK OFFICE
CERTIFICATE OF CORRECTION

PATENT NO. : 4,620,661

DATED : November 4, 1986

INVENTOR(S) : JAMES A. SLATTERY

It is certified that error appears in the above-identified patent and that said Letters Patent is hereby corrected as shown below:

On the Cover page, "Slatterly" should read --Slattery--

Signed and Sealed this

Sixth Day of October, 1987

Attest:

DONALD J. QUIGG

Attesting Officer

Commissioner of Patents and Trademarks